United States Patent [19]

Watkinson

[11] Patent Number: 4,630,315
[45] Date of Patent: Dec. 16, 1986

[54] POLAR LOOP TRANSMITTER

[75] Inventor: Stephen W. Watkinson, Cambridge, England

[73] Assignee: U.S. Philips Corporation, New York, N.Y.

[21] Appl. No.: 672,448

[22] Filed: Nov. 16, 1984

[30] Foreign Application Priority Data

Nov. 21, 1983 [GB] United Kingdom ............... 8330975

[51] Int. Cl.[4] .............................................. H04B 1/04
[52] U.S. Cl. .................................. 455/109; 455/126; 332/37 D
[58] Field of Search ................ 455/47, 108, 109, 116, 455/126; 332/37 D, 38; 330/259-261

[56] References Cited

U.S. PATENT DOCUMENTS 4,237,555 12/1980 Dishal ................................. 455/126

FOREIGN PATENT DOCUMENTS 2117589 10/1983 United Kingdom ............. 332/79 D

OTHER PUBLICATIONS

"The Design of VHF SSB Polar-Loop Transmitters" by Petrovic et al, 4/1982.

Primary Examiner—Jin F. Ng
Attorney, Agent, or Firm—Thomas A. Briody; Jack Oisher; William J. Streeter

[57] ABSTRACT

A polar loop transmitter in which a negative feedback bias adjusting system is provided to control the bias voltage applied to a differential amplifier which supplies the input envelope information to an amplitude modulator, so that the R.F. modulated output goes to zero for a zero in the input envelope information.

The negative feedback bias adjusting system comprises a threshold circuit for deriving a threshold voltage from the D.C. component in the output of the differential amplifier. This enables negative going spikes to be separated from the output waveform and their amplitude used to control the D.C. correction component which is applied to an input of the differential amplifier.

5 Claims, 13 Drawing Figures

POLAR LOOP TRANSMITTER

The present invention relates to polar loop transmitters which have particular, but not exclusive, application in a VHF single-sideband (SSB) radio system.

British Patent Specification No. 2117589A discloses a polar loop transmitter comprising an amplitude modulator for modulating an input signal onto a carrier wave and a differential amplifier for supplying a signal to be modulated to the amplitude modulator. The differential amplifier has a first input to which is applied the envelope information of the input signal, a second input to which is applied the envelope information of the transmitter output signal, an output coupled to the amplitude modulator and a bias control voltage input. The transmitter further includes a negative feedback bias adjusting system for varying the bias control voltage connected between the output and bias control voltage input of the differential amplifier.

As disclosed in British Patent Specification No. 2117589A the bias control voltage for the amplitude modulator is derived from detecting the negative going spikes in the signal from a Class B or C amplifier after this signal has been attenuated and passed through a high pass filter. The voltage in the negative spikes is stored on a capacitor which determines the bias level. At start-up it is not unusual for the signal from the Class B or C amplifier to be clipped due to the amplifier only being able to swing a certain amount. In comparing the attenuated output signal with an input signal, the differential amplifier sees the error which exists between the fully formed input waveform and the clipped output waveform and in consequence produces a relatively high error voltage which is intended to correct the output of the amplitude modulator. This attempt at correcting the signal is unsuccessful because the output of the Class B or C amplifier follows the output from the amplitude modulator so that ultimately the control voltage goes to a maximum. This is due to a property of the high pass filter being to differentiate the clipped waveform applied to it and in consequence additional high amplitude negative spikes are produced and the existence of these additional negative spikes confuse the control circuitry to a point where it controls the amplitude modulator the wrong way and makes the situation worse, that is, it limits the output of the Class B or C amplifier even more. One way of avoiding this problem is to provide an amplifier which has a greater maximum power handling capability. This is not only expensive in its own right but is needlessly expensive when coping with the start-up situation.

SUMMARY OF THE INVENTION

An object of the present invention is to prevent clipping of the output signal from the power amplifier of a polar loop transmitter in an inexpensive way.

According to the present invention there is provided a polar loop transmitter including an amplitude modulator for modulating an input signal onto a carrier wave, a differential amplifier having an output for supplying a signal to be modulated to said amplitude modulator, said differential amplifier further having a first input to which is applied envelope information of the input signal and a second input to which is applied envelope information of the transmitter output signal, and negative feedback bias adjusting means for controlling the bias voltage component in the output from said differential amplifier, wherein said bias adjusting means includes a threshold circuit by which a threshold voltage is derived from the D.C. component in the output signal from said differential amplifier, which threshold voltage is used to separate negative going spikes from said output signal and their amplitude used to control the D.C. correction component.

By the polar loop transmitter in accordance with the present invention including a threshold circuit, positive going signals are blocked and cannot produce spurious negative going spikes on being differentiated which spurious signals would confuse the control circuitry.

In an embodiment of the present invention the threshold circuit comprises a low pass filter having an input coupled to the output of the differential amplifier, storage means for storing the peak negative voltage on the output of the low pass filter and a diode whose anode is coupled to the storage means and whose cathode is coupled to the output of the differential amplifier.

By arranging the threshold circuit to derive a threshold voltage from the output of the differential amplifier rather than from say a potential divider then the circuit is able to correct for changes in RF gain of the amplitude modulator and power amplifier stages prior to the threshold determining stage. If changes in gain take place after the power amplifier threshold no change in the D.C. component of the amplitude controlling error signal will take place.

DESCRIPTION OF THE FIGURES

The present invention will now be explained and described, by way of example, with reference to the accompanying drawings, wherein.

DESCRIPTION OF THE PREFERRED EMBODIMENT

Figure 1:
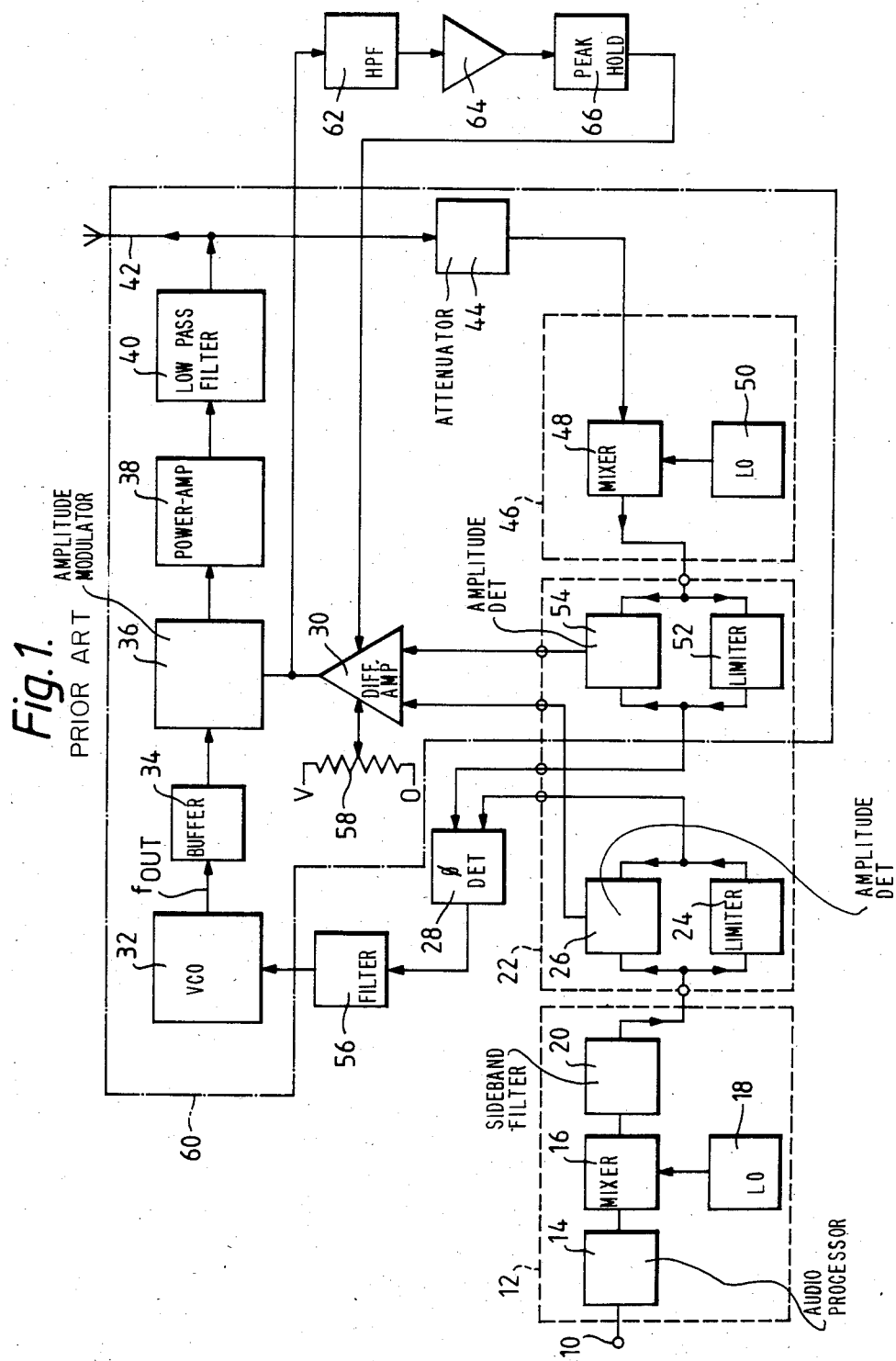
FIG. 1 is a block schematic circuit diagram of the embodiment of a polar loop transmitter disclosed in British Patent Specification No. 2117589A.

The polar loop transmitter shown in FIG. 1 comprises an input 10 for an audio frequency signal in the frequency range 300 Hz to 3.3 kHz. The signal is passed to a single sideband generator 12 which in the drawing comprises an audio processor 14 whose output is connected to one input of a balanced mixer 16 which has a second input for an output from a local oscillator 18. The local oscillator 18 is constructed to produce the purest possible signal output at say 10.7 MHz. The output from the balanced mixer 16 is applied to a sideband filter 20 which selects either the upper or lower sideband and rejects the other(s).

A polar resolver 22 is connected to an output of the sideband filter 20 for resolving the selected sideband signal into polar components. The polar resolver 22 comprises a first limiter 24 which removes the amplitude variations from the signal but preserves the phase information and a first amplitude detector 26 which produces a signal which corresponds to the envelope of the SSB signal, that is, the amplitude information. The phase information is applied to one input of a phase sensitive detector 28 and the amplitude information is applied to one input of a differential amplifier 30 which is implemented as an operational amplifier.

A voltage controlled oscillator 32 generates a signal at the transmitter frequency, $f_{out}$, which signal is applied via a buffer 34 to one input of an amplitude modulator 36 whose output is applied to a class B or class C R.F. power amplifier 38. The output from the power amplifier 38 is applied via a low pass filter 40, to an output load in the form of an antenna 42.

In order to reduce any errors of phase and amplitude in the signal being copied, a feedback loop is provided. This loop comprises an attentuator 44 for deriving a portion of the output signal. A frequency converter 46 is connected to the output of the attentuator 44. The converter 46 comprises a mixer 48 which receives a frequency ($f_{out}$—10.7 MHz) from a synthesised local ocsillator 50. The output from the mixer 48, which output comprises a frequency translated reproduction of the transmitter output signal, is applied to a second limiter 52 and a second amplitude detector 54 of the polar resolver 22. The phase information from the second limiter 52 is applied as a second input to the phase sensitive detector 28. Any phase differences detected are amplified and filtered in an amplifier and filter 56 and the output therefrom is applied as a correction signal to the voltage controlled oscillator 32. The amplitude information from the second amplitude detector 54 is applied as a second input to the differential amplifier 30. The difference between the two amplitude information signals is applied as a control input voltage to the amplitude modulator 36.

In order for the transmitter to be able to follow the low level input signal when it goes to zero then the amplitude modulator 36 must be capable of reducing the transmitter output level to say of the order of −70 dB with respect to peak envelope power. By following the modulator 36 with the class B or class C amplifier 38 then this performance can be achieved. Such an amplifier 38 has an input threshold level below which the output level is greatly attenuated. In consequence, the amplitude modulator 36 need only reduce the output level to perhaps −20 dB in such a system.

Figure 2:
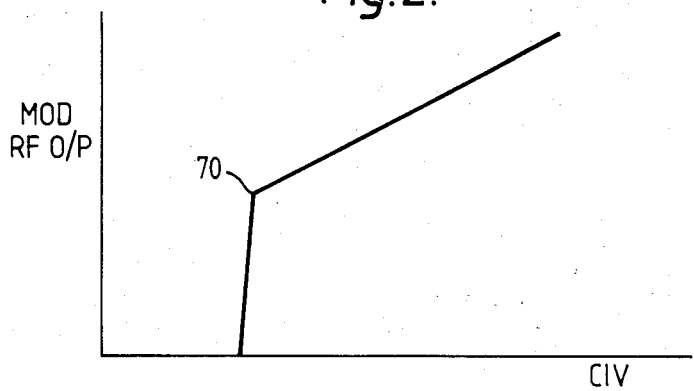
FIG. 2 is a graph of the control input voltage (CIV) plotted against modulator R.F. output voltage (MOD R.F. o/p)

FIG. 2 illustrates a graph of control input voltage (CIV) plotted against modulated R.F. output level for a composite modulator formed by the modulator 36 and the R.F. power amplifier 38. The graph exhibits an abrupt discontinuity or a sharp knee 70 which illustrates that the setting of the D.C. component in the control input voltage is critical with respect to the knee 70. The D.C. component is set using a potentiometer 58.

Figure 3:
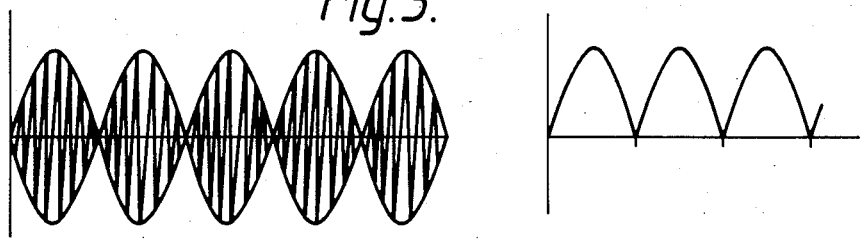
FIGS. 3, 4 and 5 show on the left waveforms illustrating respectively a two-tone input SSB signal and the effects of too low and too high D.C. control input voltages on the SSB signal (FIG. 3) being copied and on the right the control input voltages applied to an amplitude modulator 36 to produce these waveforms.
Figure 4:
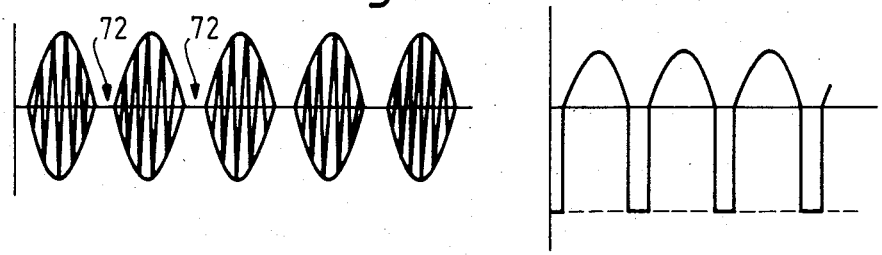
Figure 5:
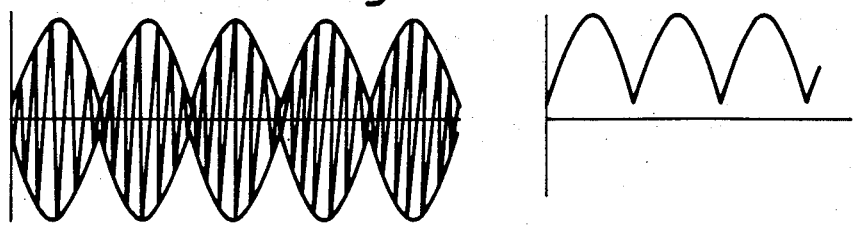

FIG. 3 shows on the left a typical two tone signal SSB waveform which is to be copied. If the waveform has been copied correctly then the output waveform would be an amplified version of the input one. However, if the D.C. bias component of the control input voltage to the amplitude modulator 36 is too low then as shown on the left in FIG. 4 the amplified signal goes to zero too soon so that gaps 72 appear between the envelopes at zero R.F. output level. The left hand waveform in FIG. 5 shows in contrast the effect of the D.C. bias component of the control input voltage being too high, see the right hand wavform in FIG. 5, with the result that the modulated R.F. output voltage cannot reach zero for a zero level in the input SSB waveform to be copied. Thus slight errors in this D.C. component of the control input voltage will produce a considerable increase in spurious output signals from the transmitter. A bias control network is included in the transmitter to hold automatically the D.C. bias component in the control input voltage at its optimum value.

In FIG. 1 the amplitude correction loop 60 proper is enclosed within the block outlined by dots and dashes. The amplitude correction loop 60 has a low voltage gain of the order of one when there is negative feedback but below the abrupt discontinuity or knee 70 (FIG. 2) the amplitude modulator has a high gain, for example $\times 10^5$.

The potentiometer 58 is accurately adjusted so that the D.C. component in the differential amplifier 30 output corresponds closely to the knee 70 (FIG. 2) thus enabling the amplitude correction loop 60 to reduce the R.F. output envelope significantly (for example −70 dB with respect to peak envelope power) at zero crossings of the input waveform shown on the left in FIG. 3.

If the D.C. bias set by the potentiometer 58 is slightly too low such that negative input peaks take the output below the knee 70, then the negative feedback loop around the differential amplifier 30 will be broken and the output voltage will fall rapidly with the result that negative going spikes will be produced due to the full open loop gain of the differential amplifier 30. As the slope of input to output of the amplitude correction loop 60 has a finite but very steep slope below the knee (FIG. 2), the amplitude of the spikes will change significantly with slight adjustment of the potentiometer 58. Compare the control input voltage shown in the right hand waveform in FIG. 4 with that shown on the right hand side of FIG. 3 in which the negative spikes are just discernable.

The presence of these negative peaks can be used to provide an automatic D.C. bias control for the differential amplifier 30.

In FIG. 1 the bias control network comprises a high pass filter 62, an A.C. amplifier 64 and a peak level hold circuit 66, connected between an output of the differential amplifier 30 and a bias control input of the amplifier 30. In use the value of negative spikes is held by the circuit 66, this value being applied as negative feedback to the differential amplifier 30. In consequence the adjustment of the potentiometer 58 will be non-critical although the closer it is set to the optimum bias setting the more rapid will be the final adjustment. However if the potentiometer 58 is set too high, the negative feedback bias adjusting system can only correct in one direction. Because the setting of the potentiometer 58 is non-critical, it could be implemented as a fixed bias network which is set at a value lower than the required optimum value. Overall the function of the bias control network is to generate a correct bias for the differential amplifier 30 such that negative spikes are only just occurring at its output, the right hand waveform in FIG. 3, when the input envelope, the left hand waveform in FIG. 3, goes through zero. A transfer characteristic of the control input voltage to the amplitude modulator plotted against the modulated R.F. output from the power amplifier exhibits an abrupt discontinuity and the negative feedback bias adjusting means is arranged to adjust the bias voltage so that for a zero in the input signal the control input voltage corresponds closely to said abrupt discontinuity.

The effectiveness of the negative feedback bias-adjusting system is dependent on the loop gain. By providing the A.C. amplifier 64 it will amplify the negative spikes but not the peak held D.C. voltage. Additionally unlike a D.C. amplifier, which may exhibit D.C. drift with variations in temperature, an A.C. amplifier will not introduce such D.C. drifts.

A further requirement of the negative feedback bias-adjusting system is that it must only adjust the bias when there are zero crossings in the input waveform (FIG. 3). If zero crossings do not occur, for example because there is a constant amplitude envelope due to the input signal being a single tone audio modulation or a pilot carrier and no modulation, the bias must be maintained at a preset level and the negative feedback bias-adjusting system inhibited. Two circuit arrangements for inhibiting the negative feedback bias-adjusting system are disclosed in British Patent Specification No. 2117589A details of which are incorporated by way of reference.

Figures 6, 7, 8:
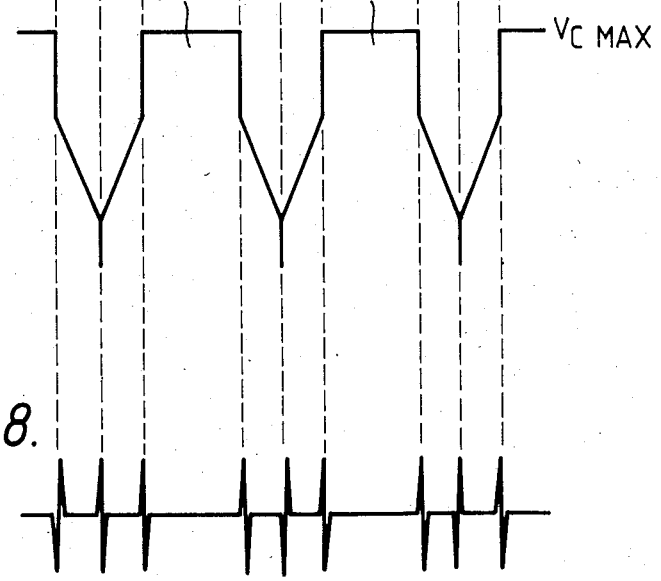
FIG. 6 shows a clipped output envelope from the power amplifier during start-up of the transmitter.
FIG. 7 shows the error signal.
FIG. 8 shows the output of the high pass filter wherein the error signal of FIG. 7 is differentiated.

The known circuit described so far operates satisfactorily provided the amplifier 38 is not overloaded as may occur during start-up of the transmitter. FIG. 6 illustrates an overloaded, clipped waveform of a two tone SSB at the output of the amplifier 38, the full waveform being shown in broken lines. This waveform after frequency conversion is applied to the differential amplifier 30 where it is compared with the input waveform. FIG. 7 illustrates the control input voltage (CIV) which is applied to the amplitude modulator 36. It will be noted that the CIV comprises not only negative spikes but also substantially rectangular positive voltage swings 74 which have a peak at the maximum control voltage positive swing, $V_{cmax}$. The reason for the swings 74 is that the control loop around the differential amplifier 30 is broken and hence the fast rise to the maximum positive voltage.

This waveform is also applied to the high pass filter 62 of the bias control network which differentiates the waveform shown in FIG. 7 and produces an output of the form shown in FIG. 8. Thus, unlike the situation shown in the right hand side of FIG. 3 wherein the output from the filter 62 will be a single negative pulse corresponding to each zero crossing, one now has three times the number of negative going spikes which will cause the bias control network to malfunction due to the charge on a capacitor in the peak level hold circuit 66 increasing causing the control signal applied to the differential amplifier 30 to increase making the situation worse.

In order to overcome this problem the polar loop transmitter made in accordance with the present invention includes a threshold circuit whereby only the negative going signals shown in Figure are passed.

Figure 9:
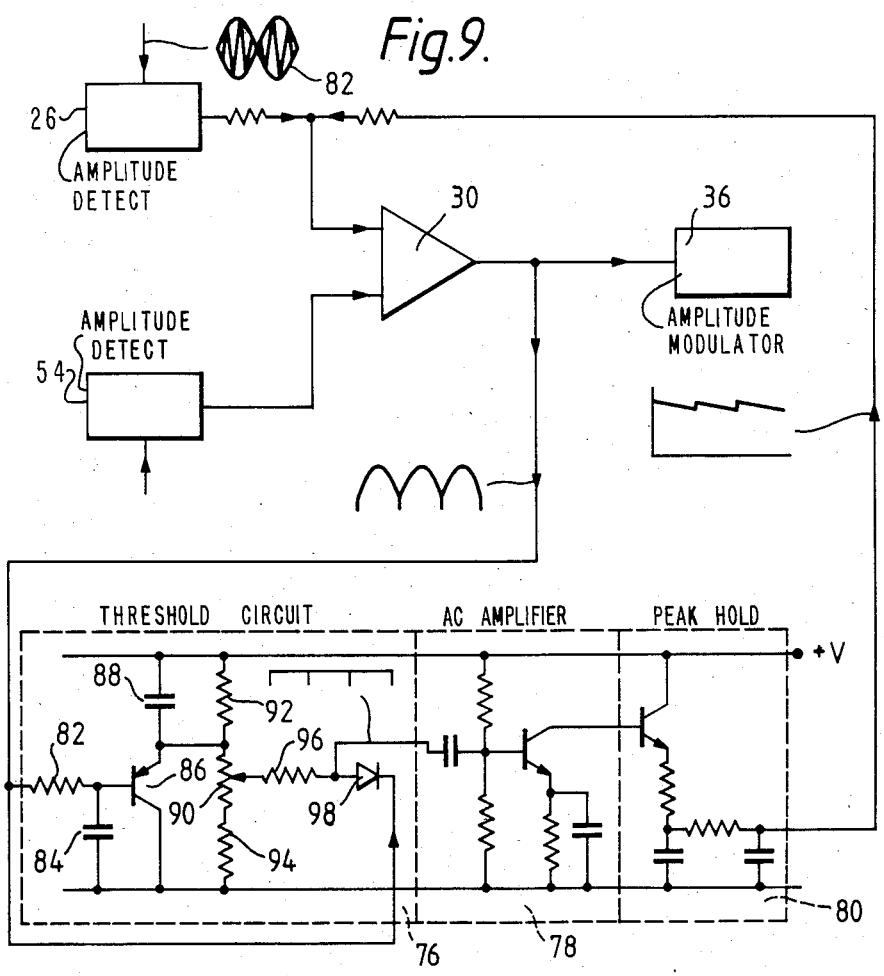
FIG. 9 is a schematic circuit diagram of a bias control network including a threshold circuit which is used instead of the network shown in FIG. 1, and FIGS. 10A to 10D are waveform diagrams to facilitate the understanding of the operation of the threshold circuit.

The circuit shown in FIG. 9 replaces the bias control network 62, 64 and 66 shown in FIG. 1 and uses a threshold voltage derived from the d.c. component in the error signal from the differential amplifier 30. This will enable the negative going spikes to be separated from the waveform and their amplitude used to control the d.c. correction component. More particularly the circuit comprises a threshold circuit 76 whose output is coupled to an A.C. amplifier 78 which in turn is coupled to a peak hold circuit 80. The output from the circuit 80 is coupled back and combined with the frequency shifted envelope of the input signal 82. The combined signal is applied to a first input of the differential amplifier 30, to a second input of which is applied the attenuated, frequency converted envelope of the output signal applied to the antenna (not shown).

Figure 10A:
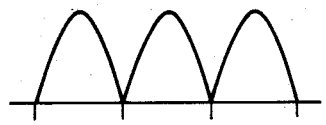
Figure 10B:
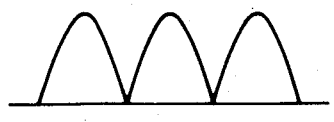
Figure 10C:
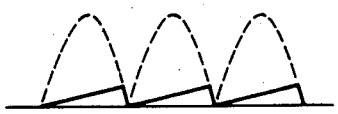
Figure 10D:
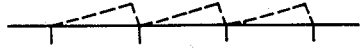

The threshold circuit 76 comprises a low pass filter formed by a resistor 82 and a capacitor 84. The low pass filter separates the low frequency envelope component from the negative spikes present in the input signal shown in FIG. 10A, the envelope component being shown in FIG. 10B. A P.N.P. emitter follower transistor 86 is coupled to the output of the low pass filter. A storage capacitor 88 is provided in the emitter circuit of the transistor 86 and stores the peak negative voltage. FIG. 10C, in the envelope component which is shown in broken lines. The emitter of the transistor 86 is coupled to a resistive potential divider network comprising a potentiometer 90 with resistors 92, 94 connected to the opposite ends thereof. The tap of the potentiometer 90 is coupled by way of a series resistor 96 to the anode of a diode 98, the cathode of which is coupled back to the output of the amplifier 30. As the peak negative voltage is substantially zero at the occurrence of the negative peaks in the output from the amplifier 30, then the diode 98 will only pass the negative going spikes as shown in FIG. 10D, the peak negative voltage being shown in broken lines.

This signal is amplified in the amplifier 78 which is of conventional design and the output is applied to the peak hold circuit 80.

In designing the circuit shown in FIG. 9, the time constant of the low pass filter should be no larger than is necessary to remove the fast negative spikes otherwise there will be a delay in the threshold voltage being established.

One of the practical features of difference between the bias control circuit shown in FIG. 1 and that shown in FIG. 9 is that the threshold circuit 76 does not respond to fast positive going edges. This means that the circuit shown in FIG. 9 can be used in the polar loop transmitter disclosed in British Patent Specification No. 2135546A wherein fast positive spikes have been observed at the output of the synchronous amplitude detector at zero crossings with exactly equal level tones. The fast positive spikes result from the rapid phase reversal at these instants and when differentiated produce negative spikes which will increase the bias level making the spikes even larger which is undesirable.

Furthermore by the threshold voltage being derived from the output of the differential amplifier 30 then, unlike a threshold circuit which uses says a potential divider to obtain the threshold voltage, it will be uneffected by changes in the R.F. gain of the amplitude modulator 36 and the power amplifier 38 when they occur prior to the threshold circuit.

I claim:

1. In a polar loop transmitter for generating an amplitude modulated signal which includes an amplitude modulator for modulating a carrier signal, a differential amplifier supplying an output d.c. voltage for controlling said modulator having a first input for receiving a modulating signal, and a second input receiving a detected envelope signal in said transmitter, a negative feedback circuit for maintaining said differential amplifier output d.c. voltage at a level which will avoid clipping of said amplitude modulated signal, comprising:

means connected to said differential amplifier for detecting voltage spikes of a like polarity indicating said envelope signal is being driven through zero level;

means for generating a threshold voltage proportional to said differential amplifier output d.c. voltage; and means for generating a negative feedback signal for controlling said differential amplifier when said voltage spikes exceed said threshold voltage, said negative feedback signal modifying said differential amplifier output d.c. voltage in a direction to minimize said voltage spikes.

2. A transmitter as claimed in claim 1 further comprising an RF power amplifier connected to receive a modulated carrier signal from said amplitude modulator, said RF power amplifier and amplitude modulator input to output characteristic having an abrupt change below a predetermined input power level, said negative feedback circuit biasing said differential amplifier to provide an operating level for said amplitude modulator which produces said predetermined input power level when a modulating signal of zero level is received by said differential amplifier first input.

3. In a polar loop transmitter for generating an amplitude modulated signal having an amplitude modulator, a differential amplifier having an output with a d.c. voltage component for controlling said modulator and having a first input for receiving a modulating signal, and a second input receiving a detected envelope signal, a negative feedback circuit for maintaining said differential amplifier output d.c. voltage at a level to avoid clipping of said modulated signal comprising:

a low pass filter connected to said differential amplifier output;

a peak detector connected to said low pass filter;

a threshold circuit which includes a voltage divider connected to provide a threshold voltage from said peak detector, and a diode connected at one end to said threshold voltage and at the other end to said differential amplifier output, said one end producing a voltage pulse when said voltage spikes exceed said threshold value; and means for generating a d.c. voltage proportional to said diode one end voltage pulse for biasing said differential amplifier.

4. The transmitter of claim 3 wherein said means for generating a d.c. voltage proportional to said diode one end voltage pulse includes a peak level hold circuit.

5. The transmitter of claim 4 wherein an a.c. amplifier is connected between said peak level hold circuit and said diode one end.

* * * * *